(12) United States Patent
Kwon et al.

(10) Patent No.: US 8,698,251 B2
(45) Date of Patent: Apr. 15, 2014

(54) ORGANIC LIGHT EMITTING DIODE DISPLAY AND METHOD OF MANUFACTURING THE SAME

(75) Inventors: Oh-Seob Kwon, Yongin (KR); Moo-Soon Ko, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 629 days.

(21) Appl. No.: 12/662,362

(22) Filed: Apr. 13, 2010

(65) Prior Publication Data

US 2011/0079786 A1    Apr. 7, 2011

(30) Foreign Application Priority Data

Oct. 6, 2009   (KR) .................. 10-2009-0094841

(51) Int. Cl.
   *H01L 27/11*   (2006.01)
   *H01L 21/00*   (2006.01)
   *H01L 21/84*   (2006.01)

(52) U.S. Cl.
   USPC .................. 257/379; 257/E27.113; 438/149; 438/155; 438/171

(58) Field of Classification Search
   USPC .................................. 257/E27.113, E51.002
   See application file for complete search history.

(56) References Cited

U.S. PATENT DOCUMENTS

| 2008/0093602 A1 | 4/2008 | Matsumura et al. |
| 2008/0233665 A1* | 9/2008 | Jung et al. ............ 438/23 |
| 2009/0302332 A1* | 12/2009 | Kang et al. ............ 257/88 |

FOREIGN PATENT DOCUMENTS

| JP | 2007-281155 A | 10/2007 |
| KR | 10-0195253 B1 | 2/1999 |

* cited by examiner

*Primary Examiner* — Daniel Whalen
(74) *Attorney, Agent, or Firm* — Lee & Morse, P.C.

(57) ABSTRACT

An organic light emitting diode display includes a substrate, a semiconductor layer on the substrate, the semiconductor layer including an impurity-doped polycrystalline silicon layer, a first capacitor electrode on the substrate main body, the first capacitor electrode including an impurity-doped polycrystalline silicon layer, and bottom surfaces of the first capacitor electrode and semiconductor layer facing the substrate main body being substantially coplanar, a gate insulating layer on the semiconductor layer and the first capacitor electrode, a gate electrode on the semiconductor layer with the gate insulating layer therebetween, and a second capacitor electrode on the first capacitor electrode with the gate insulating layer therebetween, bottom surfaces of the second capacitor electrode and gate electrode facing the substrate main body being substantially coplanar, and the second capacitor electrode having a smaller thickness than the gate electrode.

20 Claims, 17 Drawing Sheets

ORGANIC LIGHT EMITTING DIODE DISPLAY AND METHOD OF MANUFACTURING THE SAME

BACKGROUND

1. Field

The described technology relates to an organic light emitting diode display. More particularly, the described technology relates to an organic light emitting diode display having an impurity-doped polycrystalline silicon layer as a capacitor electrode.

2. Description of the Related Art

An organic light emitting diode (OLED) display is a self-emissive display device which displays images with OLEDs. The OLED display differs from a liquid crystal display (LCD) in that it does not require a separate light source, and has relatively small thickness and weight. Furthermore, as the OLED display involves high quality characteristics, e.g., low power consumption, high luminance, and short response time, it is spotlighted as a next generation display device, e.g., for portable electronic appliances.

The OLED displays may be classified into passive matrix and active matrix types depending upon the way of driving them. In the active matrix type of OLED display, an OLED, a thin film transistor (TFT), and a capacitor are formed at respective pixels so as to control each pixel in an independent manner.

The above information disclosed in this Description of Related Art section is only for enhancement of understanding of the background of the described technology and therefore it may contain information that does not form the prior art that is already known in this country to a person of ordinary skill in the art.

SUMMARY

Embodiments are directed to an OLED display, which substantially overcomes one or more of the problems due to the limitations and disadvantages of the related art.

It is therefore a feature of an embodiment to provide an OLED display with an impurity-doped polycrystalline silicon layer that can be effectively used as a capacitor electrode.

It is therefore another feature of an embodiment to provide a simplified method of manufacturing an OLED display having an impurity-doped polycrystalline silicon layer as the capacitor electrode.

At least one of the above and other features and advantages may be realized by providing an OLED display, including a substrate main body, and a semiconductor layer, and a first capacitor electrode formed on the substrate main body while standing on the same plane. A gate insulating layer may be formed on the semiconductor layer and the first capacitor electrode. A gate electrode may be formed on the semiconductor layer by interposing the gate insulating layer therebetween. A second capacitor electrode may be formed on the first capacitor electrode by interposing the gate insulating layer therebetween while standing on the same plane as the gate electrode. The first capacitor electrode and the semiconductor layer may each include an impurity-doped polycrystalline silicon layer, and the second capacitor electrode may have a smaller thickness than the gate electrode.

The gate electrode and the second capacitor electrode may contain the same metallic material, which includes at least one material selected from molybdenum (Mo), chromium (Cr), and tungsten (W).

The gate electrode may have a thickness of 170 nm or more, and the thickness of the second capacitor electrode may be 75% or less of the thickness of the gate electrode.

The impurity doped at the first capacitor electrode and the semiconductor layer respectively may include an impurity selected from a P-type impurity and an N-type impurity. The impurity may include boron.

The gate insulating layer may contain at least one material selected from tetraethoxysilane (TEOS), silicon nitride ($SiN_x$), and silicon oxide ($SiO_x$).

The semiconductor layer may include a channel region overlapped with the gate electrode, and source and drain regions formed at both sides of the channel region.

The channel region of the semiconductor layer may be formed with an intrinsic semiconductor, while the source and drain regions of the semiconductor layer and the first capacitor electrode are formed with an impurity semiconductor.

With the organic light emitting diode display, the second capacitor electrode may have a thickness of 10 nm to 140 nm.

At least one of the above and other features and advantages may also be realized by providing a method of manufacturing an OLED display, including forming a semiconductor layer on a substrate main body, the semiconductor layer including an impurity-doped polycrystalline silicon layer, forming a first capacitor electrode on the substrate main body, such that bottom surfaces of the first capacitor electrode and semiconductor layer facing the substrate main body are substantially coplanar, and the first capacitor electrode includes an impurity-doped polycrystalline silicon layer, forming a gate insulating layer on the semiconductor layer and the first capacitor electrode, forming a gate electrode on the semiconductor layer with the gate insulating layer therebetween, and forming a second capacitor electrode on the first capacitor electrode with the gate insulating layer therebetween, such that bottom surfaces of the second capacitor electrode and gate electrode facing the substrate main body are substantially coplanar, and the second capacitor electrode has a smaller thickness than the gate electrode.

The method may further include forming a polycrystalline silicon layer on the substrate main body. The polycrystalline silicon layer may be patterned to form a semiconductor layer precursor and a first capacitor electrode precursor. A gate insulating layer may be formed on the semiconductor layer precursor and the first capacitor electrode precursor. A gate electrode may be formed on the gate insulating layer such that the gate electrode is partially overlapped with the semiconductor layer precursor, while a second capacitor electrode is formed on the gate insulating layer such that the second capacitor electrode is overlapped with the first capacitor electrode precursor. An impurity may be doped at the semiconductor layer precursor and the first capacitor electrode precursor to form a semiconductor layer and a first capacitor electrode. The second capacitor electrode may have a smaller thickness than the gate electrode, and the impurity may be doped at the first capacitor electrode while passing through the second capacitor electrode.

The gate electrode and the second capacitor electrode may contain the same metallic material, which includes at least one material selected from molybdenum (Mo), chromium (Cr), and tungsten (W).

The gate electrode may have a thickness of 170 nm or more, and the thickness of the second capacitor electrode may be 75% or less of the thickness of the gate electrode.

The second capacitor electrode may have a thickness of 10 nm to 140 nm.

The impurity may include an impurity selected from a P-type impurity and an N-type impurity. The impurity may include boron.

The impurity may be ion-injected with an energy of 80 keV or more at a dose of $1.0e15$ atoms/cm$^2$ or more.

The gate insulating layer may contain at least one material selected from tetraethoxysilane (TEOS), silicon nitride (SiN$_x$), and silicon oxide (SiO$_x$).

The semiconductor layer may include a channel region overlapped with the gate electrode, and source and drain regions formed at both sides of the channel region.

The channel region of the semiconductor layer may be formed with an intrinsic semiconductor, while the source and drain regions of the semiconductor layer and the first capacitor electrode are formed with an impurity semiconductor.

With the method, the gate electrode and the second capacitor electrode may be formed by forming a gate metal layer on the gate insulating layer, and patterning the gate metal layer through photolithography based on a photoresist pattern. The photoresist pattern may have a first portion formed over the gate electrode, and a second portion formed over the second capacitor electrode with a smaller thickness than the first portion.

It is possible for the gate metal layer to be etched through the photoresist pattern to form the gate electrode and a second capacitor electrode precursor, and the second portion of the photoresist pattern is removed while partially etching the second capacitor electrode precursor to form the capacitor electrode.

The photoresist pattern may be formed by forming a photoresist film on the gate metal layer, firstly exposing the photoresist film to light through a first mask, secondly exposing the photoresist film through a second mask, and developing the photoresist film.

The first mask may include a gate shield for preventing the location of the gate electrode from being exposed to light, and a capacitor shield for preventing the location of the second capacitor electrode from being exposed to light.

The second mask may include a gate shield for preventing the location of the gate electrode from being exposed to light.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
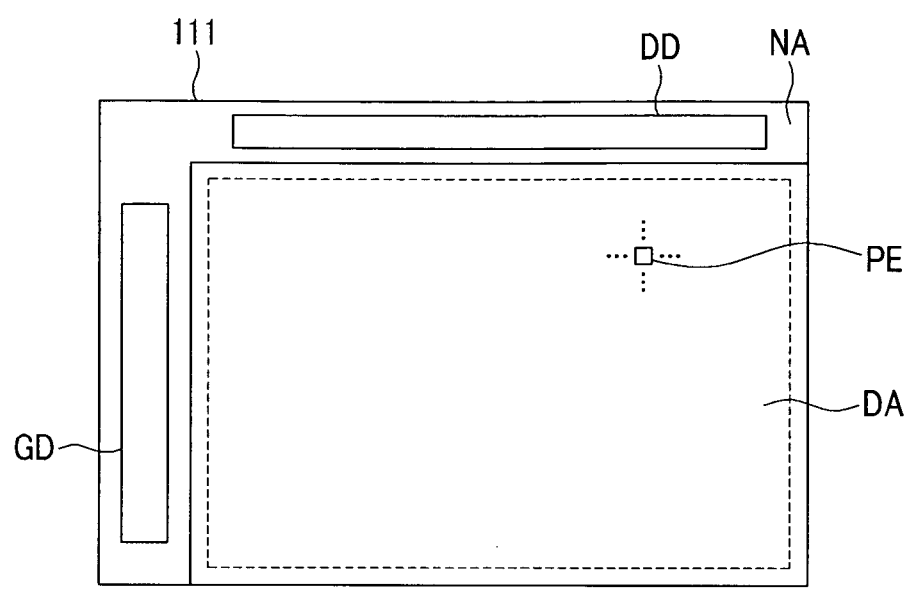
FIG. 1 illustrates a schematic top plan view of an OLED display according to an exemplary embodiment.

Korean Patent Application No. 10-2009-0094841, filed on Oct. 6, 2009, in the Korean Intellectual Property Office, and entitled: "Organic Light Emitting Diode Display and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Parts that are irrelevant to the description are omitted in order to clearly describe example embodiments, and like reference numerals refer to like elements throughout.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present.

An OLED display 101 according to an exemplary embodiment will be now described with reference to FIG. 1 to FIG. 3.

As illustrated in FIG. 1, the OLED display 101 may include a substrate main body 111 with a display area DA and a non-display area NA. A plurality of pixels (PE) may be formed at the display area DA of the substrate main body 111 so as to display images, and one or more driving circuits GD and DD may be formed at the non-display area (NA). The driving circuits GD and DD may include TFTs. It is noted, however, that the driving circuits GD and DD may be omitted. A structure of one pixel PE will be described in more detail below with reference to FIG. 2.

Figure 2:
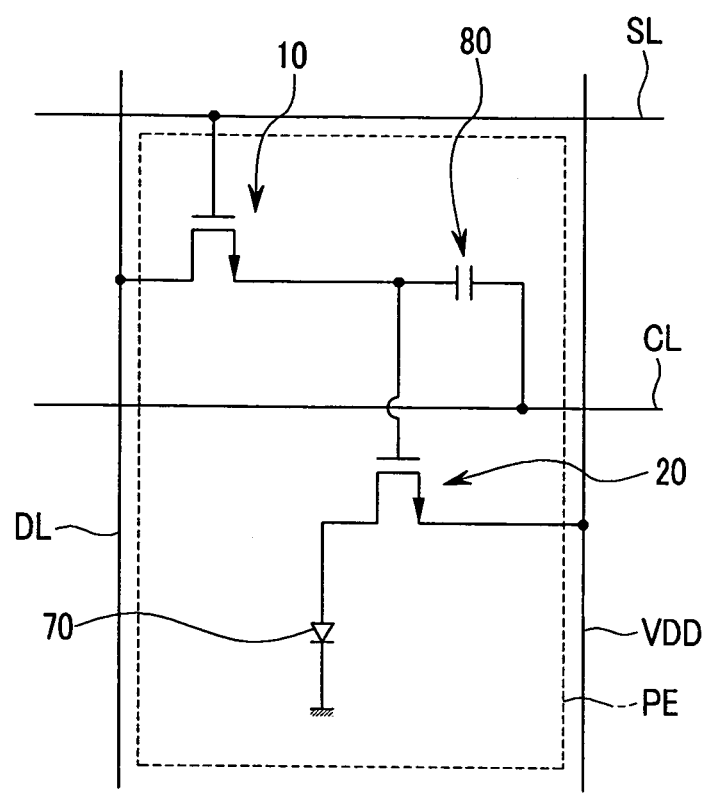
FIG. 2 illustrates a circuit diagram of a pixel circuit of the OLED display in FIG. 1.

As illustrated in FIG. 2, the pixel PE may have a 2Tr-1Cap structure with an OLED 70, first and second TFTs 10 and 20, and a capacitor 80. However, an exemplary embodiment is not limited thereto. For example, the OLED display 101 may be variously structured such that three or more TFTs and two or more capacitors may be provided in one pixel PE together with a separate wire, e.g., the additional TFTs and capacitors may form a compensation circuit. The compensation circuit improves the uniformity of the OLED 70 formed in each pixel PE, and prevents deterioration of the image quality. The compensation circuit may include two to eight TFTs.

The OLED 70 includes an anode, i.e., a hole injection electrode, a cathode, i.e., an electron injection electrode, and an organic emissive layer disposed between the anode and the cathode. The structure of the OLED 70 will be described in more detail below with reference to FIG. 3.

Each of the first and second TFTs 10 and 20 may include a gate electrode, a semiconductor layer, a source electrode, and a drain electrode. At least one of the first and second TFTs 10 and 20 may have a semiconductor layer that includes an impurity-doped polycrystalline silicon layer. That is, at least one of the first and second TFTs 10 and 20 may be a polycrystalline silicon TFT.

As further illustrated in FIG. 2, the pixel PE may be connected to a gate line SL, a data line DL, a common power line VDD, and a capacitor line CL. However, an exemplary embodiment is not limited to the structure illustrated in FIG. 2, e.g., the capacitor line CL may be omitted as needed.

As further illustrated in FIG. 2, a source electrode of the TFT 10 is connected to the data line DL, and a gate electrode of the first TFT 10 is connected to the gate line SL. A drain electrode of the first TFT 10 is connected to the capacitor line CL via the capacitor 80. A node is formed between the drain electrode of the first TFT 10 and the capacitor 80, and the gate electrode of the second TFT 20 is connected to the node. A common power line VDD is connected to the drain electrode of the second TFT 20, and the anode electrode of the OLED 70 is connected to the source electrode of the second TFT 20.

The first TFT 10 may be used as a switch for selecting a target pixel PE to be excited. When the first TFT 10 turns on, the capacitor 80 is charged. At this time, the amount of charges is proportional to the potential of the voltage applied from the data line DL. When the first TFT 10 turns off and signals are input into the capacitor line CL, while increasing the voltage by a cycle of one frame, the gate potential of the second TFT 20 is increased along with the voltage applied through the capacitor line CL, based on the potential of the capacitor 80. When the gate potential of the second TFT 20 goes over a threshold voltage, the second TFT 20 turns on. Then, the voltage applied to the common power line VDD is applied to the OLED 70 through the second TFT 20 so that the OLED 70 emits light. The structure of the pixel PE is not limited to the above-described, but may be variously modified.

The OLED display 101 according to an exemplary embodiment will now be described in detail with reference to FIG. 3. FIG. 3 illustrates a partial amplified cross-sectional view of the OLED display 101. It is noted that FIG. 3 illustrates only the second TFT 20 of the first and second TFTs 10 and 20 for clarity.

Figure 3:
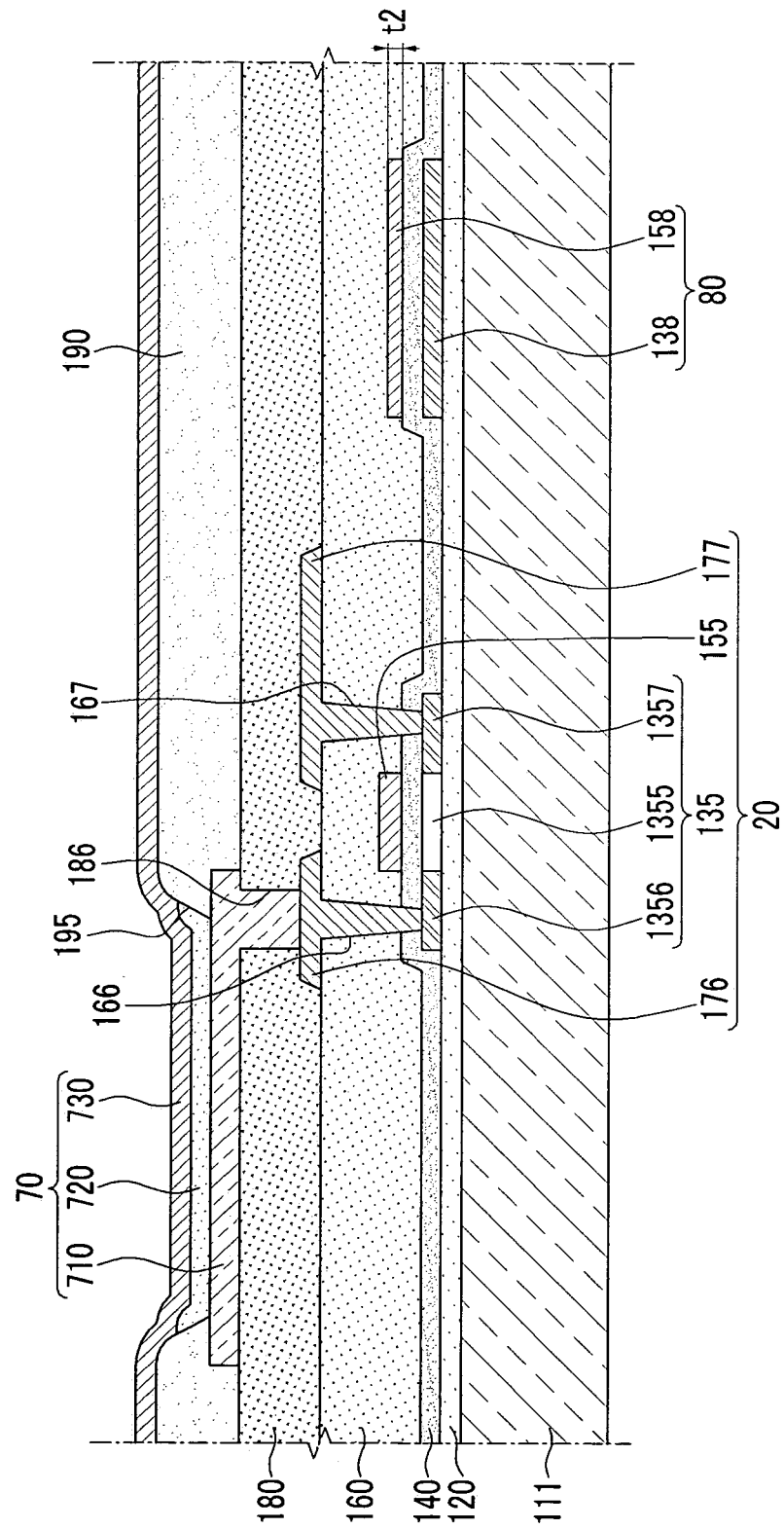
FIG. 3 illustrates a partial amplified cross-sectional view of the OLED display in FIG. 1.

Referring to FIG. 3, the substrate main body 111 may be formed of an insulating material, e.g., one or more of glass, quartz, ceramic, plastic, etc. However, an exemplary embodiment is not limited thereto, and the substrate main body 111 may be formed of a metallic material, e.g., stainless steel.

A buffer layer 120 may be formed on the substrate main body 111. For example, the buffer layer 120 may include a single-layered structure based on silicon nitride ($SiN_x$), or a double-layered structure based on silicon nitride ($SiN_x$) and silicon oxide ($SiO_x$). The buffer layer 120 may prevent unneeded components, e.g., impure elements or moisture, from penetrating into a target material, e.g., the substrate main body 111, while flattening the surface thereof. However, the buffer layer 120 is not necessarily required and may be omitted, e.g., based on the kind and processing conditions of the substrate main body 111.

A semiconductor layer 135 and a first capacitor electrode 138 may be formed, e.g., simultaneously, on, e.g., directly on, the buffer layer 120. That is, the semiconductor layer 135 and the first capacitor electrode 138 may be formed on, e.g., directly on, the same plane, e.g., bottom surfaces of the semiconductor layer 135 and first capacitor electrode 138 that face the main substrate body 111 may be substantially coplanar. The semiconductor layer 135 and the first capacitor electrode 138 may each include an impurity-doped polycrystalline silicon layer.

In detail, the semiconductor layer 135 may include a channel region 1355, and source and drain regions 1357 and 1356 formed at both sides of the channel region 1355. The channel region 1355 of the semiconductor layer 135 may be formed with a non-doped polycrystalline silicon layer, i.e., an intrinsic semiconductor. The source and drain regions 1357 and 1356 of the semiconductor layer 135 may be formed with the impurity-doped polycrystalline silicon layer, i.e., an extrinsic semiconductor. The first capacitor electrode 138 may be formed with the impurity-doped polycrystalline silicon layer, i.e., substantially the same material as the source and drain regions 1357 and 1356 of the semiconductor layer 135. For example, the first capacitor electrode 138 and the source and drain regions 1357 and 1356 of the semiconductor layer 135 may be completed simultaneously.

The impurity doped onto the source and drain regions 1357 and 1356 of the semiconductor layer 135 and the first capacitor electrode 138 may be any one of a P-type impurity and an N-type impurity. The impurity may be differentiated in kind depending upon the second TFT 20. For example, the P-type impurity may include boron (B), e.g., $B_2H_5$, so boron ions may be doped into the polycrystalline silicon layer to form the first capacitor electrode 138 and the source and drain regions 1357 and 1356 of the semiconductor layer 135. It is noted, however, that the impurity is not limited to the described above.

A gate insulating layer 140 may be formed on the semiconductor layer 135 and the first capacitor electrode 138. The gate insulating layer 140 may include at least one of tetraethoxysilane (TEOS), silicon nitride ($SiN_x$), and silicon oxide ($SiO_x$). For example, the gate insulating layer 140 may include a double-layered structure sequentially having a silicon nitride layer with a thickness of about 40 nm, and a tetraethoxysilane layer with a thickness of about 80 nm. However, the gate insulating layer 140 is not limited to the above-described constituents.

A gate electrode 155 and a second capacitor electrode 158 may be formed, e.g., simultaneously, on, e.g., directly on, the gate insulating layer 140. The gate electrode 155 and the second capacitor electrode 158 may be formed of a substantially same material, e.g., metal, and may be positioned on, e.g., directly on, a same plane, e.g., bottom surfaces of the gate electrode 155 and second capacitor electrode 158 that face the main substrate body 111 may be substantially coplanar. Examples of the metal material may include one or more of molybdenum (Mo), chromium (Cr), and tungsten (W). For example, the gate electrode 155 and the second capacitor electrode 158 may be formed of molybdenum (Mo) or a molybdenum alloy.

The second capacitor electrode 158 may have a smaller thickness, i.e., a distance as measured along a normal to the main body substrate 11, than that of the gate electrode 155. For example, the thickness of the second capacitor electrode 158 may be about 75% or less of the thickness of the gate electrode 155. The different thicknesses of the gate electrode 155 and second capacitor electrode 158 may facilitate different degrees of doping of corresponding underlying layers.

In detail, the gate electrode 155 may be formed on the semiconductor layer 135, and may overlap, e.g., completely overlap, the channel region 1355 of the semiconductor layer 135. Therefore, the gate electrode 155 may prevent impurities from being doped into the channel region 1355 during subsequent doping of the source and drain regions 1357 and 1356 of the semiconductor layer 135. In other words, the source and drain regions 1357 and 1356 may be doped after formation of the gate electrode 155, so the gate electrode 155 may function as a mask to prevent doping of the channel region 1355 during the doping process. Accordingly, the gate electrode 155 may have a sufficient thickness to prevent penetration of impurities therethrough, e.g., a thickness of about 170 nm or more. If the gate electrode 155 has a low thickness, e.g., less than about 170 nm, impurity may penetrate through the gate electrode 155 into the channel region 1355 of the semiconductor layer 135 during the doping process. That is, a gate electrode 155 with a thickness of about 170 nm or higher may have sufficient thickness to prevent or substantially minimize impurity doping into the channel region 1355 of the semiconductor layer 135 during manufacturing.

The second capacitor electrode 158 may be formed on the first capacitor electrode 138, and may overlap, e.g., completely overlap, the first capacitor electrode 138. The second capacitor electrode 158 may have sufficiently low thickness to allow penetration of impurities therethrough during the doping process. In other words, the impurity doped into the first capacitor electrode 138 may be doped through the second capacitor electrode 158, i.e., may penetrate through the second capacitor electrode 158. Accordingly, if the thickness of the second capacitor electrode 158 is too large, the impurity may not penetrate through the second capacitor electrode 158 into the first capacitor electrode 138, thereby causing reduced conductivity of the first capacitor electrode 138. In other words, the thickness of the second capacitor electrode 158 may be sufficiently thin, e.g., thinner than the thickness of the gate electrode 155 that prevents impurity penetration, to enable ion implantation therethrough. If the second capacitor electrode 158 is too small in thickness, however, the electrical characteristic of the second capacitor electrode 158 may be deteriorated while making the capacitance of the capacitor 80 poor. Therefore, the second capacitor electrode 158 may have a thickness of about 10 nm to about 140 nm.

When the second capacitor electrode 158 is formed on the first capacitor electrode 138 by interposing the gate insulating layer 140 therebetween, the capacitor 80 according to an exemplary embodiment may be completed. The gate insulating layer 140 may be a dielectric of the capacitor 80.

An interlayer insulating layer 160 may be formed on the gate electrode 155 and the second capacitor electrode 158. As with the gate insulating layer 140, the interlayer insulating layer 160 may be formed of one or more of tetraethoxysilane (TEOS), silicon nitride ($SiN_x$) and silicon oxide (SiOx), but is not limited thereto.

The interlayer insulating layer 160 and the gate insulating layer 140 may include source and drain contact holes 167 and 166 therethrough. The source and drain contact holes 167 and 166 may partially expose the source and drain regions 1357 and 1356 of the semiconductor layer 135, respectively.

Source and drain electrodes 177 and 176 may be formed on the interlayer insulating layer 160, such that they contact the source and drain regions 1357 and 1356 of the semiconductor layer 135 through the source and drain contact holes 167 and 166, respectively, while being spaced apart from each other by a distance. Accordingly, the second TFT 20 according to an exemplary embodiment may be completed.

Furthermore, although not illustrated in the drawings, an additional capacitor electrode may be formed on the interlayer insulating layer 160, e.g., on the same plane as the source and drain electrodes 177 and 176, with the same material. The additional capacitor may be overlapped with one or more of the first and second capacitor electrodes 138 and 158. In this way, when the additional capacitor electrode is provided, the capacitor 80 may have a dual structure with enhanced capacitance.

A planarization layer 180 may be formed on the interlayer insulating layer 160, such that it may cover the source and drain electrodes 177 and 176. The planarization layer 180 may remove and flatten a stepped difference in order to increase the emissive efficiency of the overlying OLED 70. Furthermore, the planarization layer 180 may include an anode contact hole 186 partially exposing the drain electrode 176. The planarization layer 180 may be formed of at least one of polyacrylate resin, epoxy resin, phenolic resin, polyamide resin, polyimide resin, unsaturated polyester resin, polyphenylene resin, polyphenylenesulfide resin, and benzocyclobutene (BCB).

A pixel electrode 710 of the OLED 70 may be formed on the planarization layer 180. Here, the pixel electrode 710 refers to the anode. The pixel electrode 710 may be connected to the drain electrode 176 through the anode contact hole 186 of the planarization layer 180.

A pixel definition layer 190 may be formed on the planarization layer 180 with an opening 195 exposing the pixel electrode 710. That is, the pixel electrode 710 may be disposed to correspond to the opening 195 of the pixel definition layer 190. The pixel definition layer 190 may be formed of one or more of polyacrylate resin, polyimide resin, and silica-based inorganic materials.

An organic emissive layer 720 may be formed on the pixel electrode 710 in the opening 195 of the pixel definition layer 190, and a common electrode 730 may be formed on the pixel definition layer 190 and the organic emissive layer 720. Here, the common electrode 730 refers to the cathode. In this way, the OLED 70 with the pixel electrode 710, the organic emissive layer 720, and the common electrode 730 may be completed.

The OLED display 101 may be structured, e.g., in any one of a front display type, a rear display type, and a one panel dual display type, depending upon the light-emitting direction of the OLED 70.

For example, if the OLED display 101 is structured as a front display type, the pixel electrode 710 may be formed of a reflective film, and the common electrode 730 may be formed of a semitransparent film. In another example, if the OLED display 101 is structured as a rear display type, the pixel electrode 710 may be formed of a semitransparent film, and the common electrode 730 may be formed of a reflective film. In yet another example, if the OLED display 101 is structured as a one panel dual display type, the pixel electrode 710 and the common electrode 730 may be formed of a transparent film or a semitransparent film.

The reflective film and the semitransparent film may be formed of at least one metal, e.g., one or more of magnesium (Mg), silver (Ag), gold (Au), calcium (Ca), lithium (Li), chromium (Cr), aluminum (Al), and alloys thereof. Whether a given film is a reflective film or a semitransparent film is determined depending upon the thickness thereof. The semiconductor film may have a thickness of about 200 nm or less. With the semitransparent film, light transmittance may increase as the thickness decreases, while light transmittance may decrease as the thickness increases. The transparent film may be formed of one or more of indium tin oxide (ITO), indium zinc oxide (IZO), zinc oxide (ZnO), and indium oxide ($In_2O_3$).

The organic emissive layer 720 may include a multiple-layered structure having some or all of an emission layer, a hole injection layer (HIL), a hole transporting layer (HTL), an electron transporting layer (ETL), and an electron injection layer (EIL). If the organic emissive layer 720 has all of the layers, the HIL may be disposed on the pixel electrode 710, i.e., on the anode, and may be sequentially overlaid with the HTL, the emission layer, the ETL, and the EIL. The organic emissive layer 720 may include other layers when needed.

In the above-described structure, the OLED display 101 according to an exemplary embodiment may effectively use an impurity-doped polycrystalline silicon film as the electrode for the capacitor 80. In detail, as the impurity passes through the second capacitor electrode 158 into the first capacitor electrode 138, the first capacitor electrode 138 may be easily formed with the impurity-doped polycrystalline silicon film. In other words, the first capacitor electrode 138 may be formed simultaneously with the semiconductor layer 135, e.g., both silicon layer deposition and doping, so the first capacitor electrode 138 may be easily formed to include an impurity-doped polycrystalline silicon without conducting any separate processing steps. Accordingly, the process of fabricating the OLED display 101 may be efficiently simplified.

A method of manufacturing the OLED display 101 according to an exemplary embodiment will be now described with reference to FIG. 4 to FIG. 13.

Figure 4:
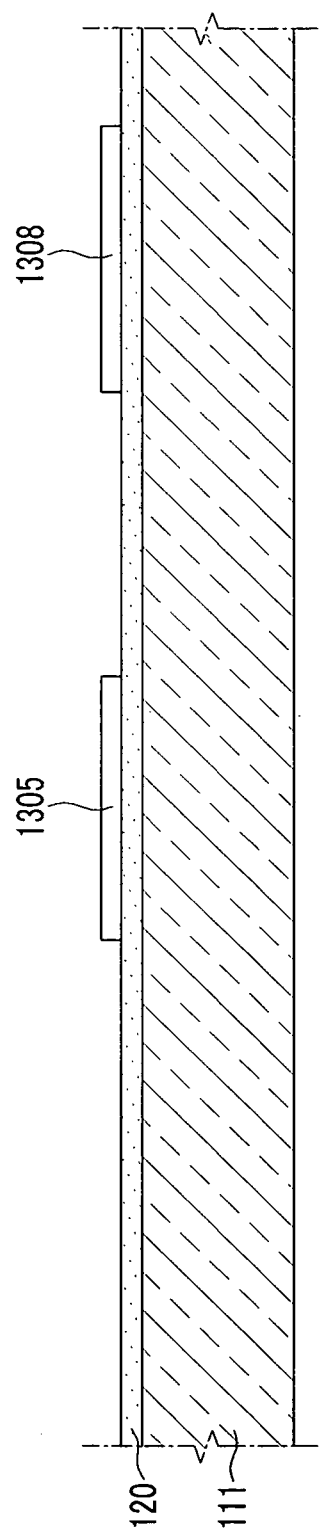
FIG. 4 to FIG. 13 illustrate cross-sectional views of stages in a method of manufacturing an OLED according to an exemplary embodiment.

First, as illustrated in FIG. 4, the buffer layer 120 may be formed on the substrate main body 111. The buffer layer 120 may be formed by depositing an inorganic insulating material, e.g., silicon nitride ($SiN_x$) and/or silicon oxide ($SiO_x$), on the entire surface of the substrate main body 111 by using any suitable deposition technique, e.g., plasma enhanced chemical vapor deposition (PECVD).

A polycrystalline silicon layer (not shown) may then be formed on the buffer layer 120. The polycrystalline silicon layer may be formed, e.g., by forming an amorphous silicon layer first and then crystallizing it. The amorphous silicon layer may be formed by using any suitable deposition technique, e.g., PECVD. Crystallization of the amorphous silicon layer may be performed by any suitable techniques, e.g., by way of heat, laser, joule heat, an electric field, or a catalytic metal. Further, a dehydrogenation process may be conducted before the crystallization in order to remove hydrogen atoms from the amorphous silicon layer.

Thereafter, the polycrystalline silicon layer may be patterned, e.g., via photolithography, to form a semiconductor layer precursor 1305 and a first capacitor electrode precursor 1308. The semiconductor layer precursor 1305 and first capacitor electrode precursor 1308 may be formed simultaneously and of the same material on the buffer layer 120. For example, as illustrated in FIG. 4, the semiconductor layer precursor 1305 and first capacitor electrode precursor 1308 may be both directly on the buffer layer 120. The semiconductor layer precursor 1305 and first capacitor electrode precursor 1308 may be horizontally spaced apart from each other.

Figure 5:
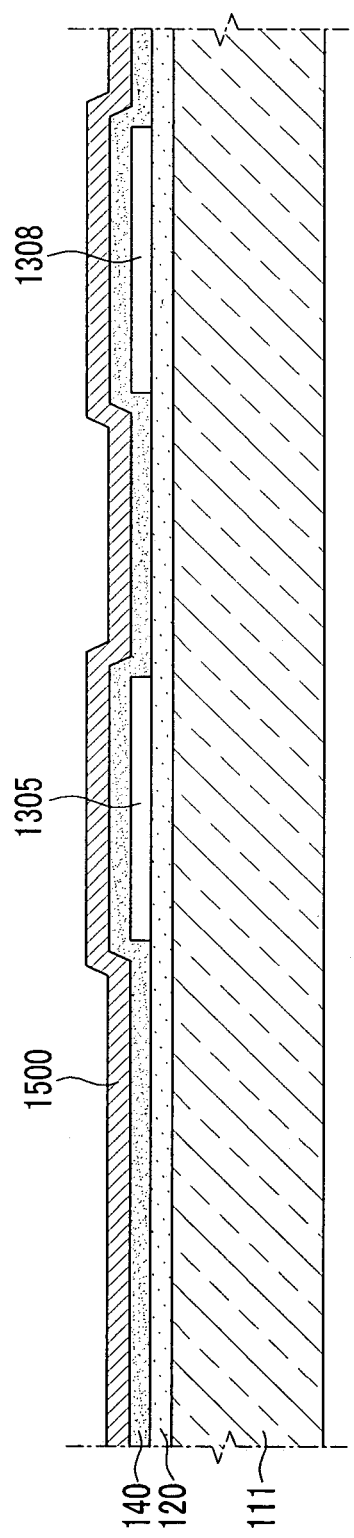

Thereafter, as illustrated in FIG. 5, the gate insulating layer 140 may be formed on the substrate main body 111 to cover, e.g., completely cover, the semiconductor layer precursor 1305 and the first capacitor electrode precursor 1308. For example, the gate insulating layer 140 may include a silicon nitride layer with a thickness of about 40 nm, and a TEOS layer on the silicon nitride layer with a thickness of about 80 nm. The inorganic layers of the gate insulating layer 140 may be formed by, e.g., PECVD.

Thereafter, a gate metal layer 1500 may be formed on the gate insulating layer 140, e.g., to overlap the semiconductor layer precursor 1305 and first capacitor electrode precursor 1308. The gate metal layer 1500 may include one or more of molybdenum (Mo), chromium (Cr), and tungsten (W). For example, the gate metal layer 1500 may be formed of molybdenum (Mo), e.g., via sputtering.

Figure 6:
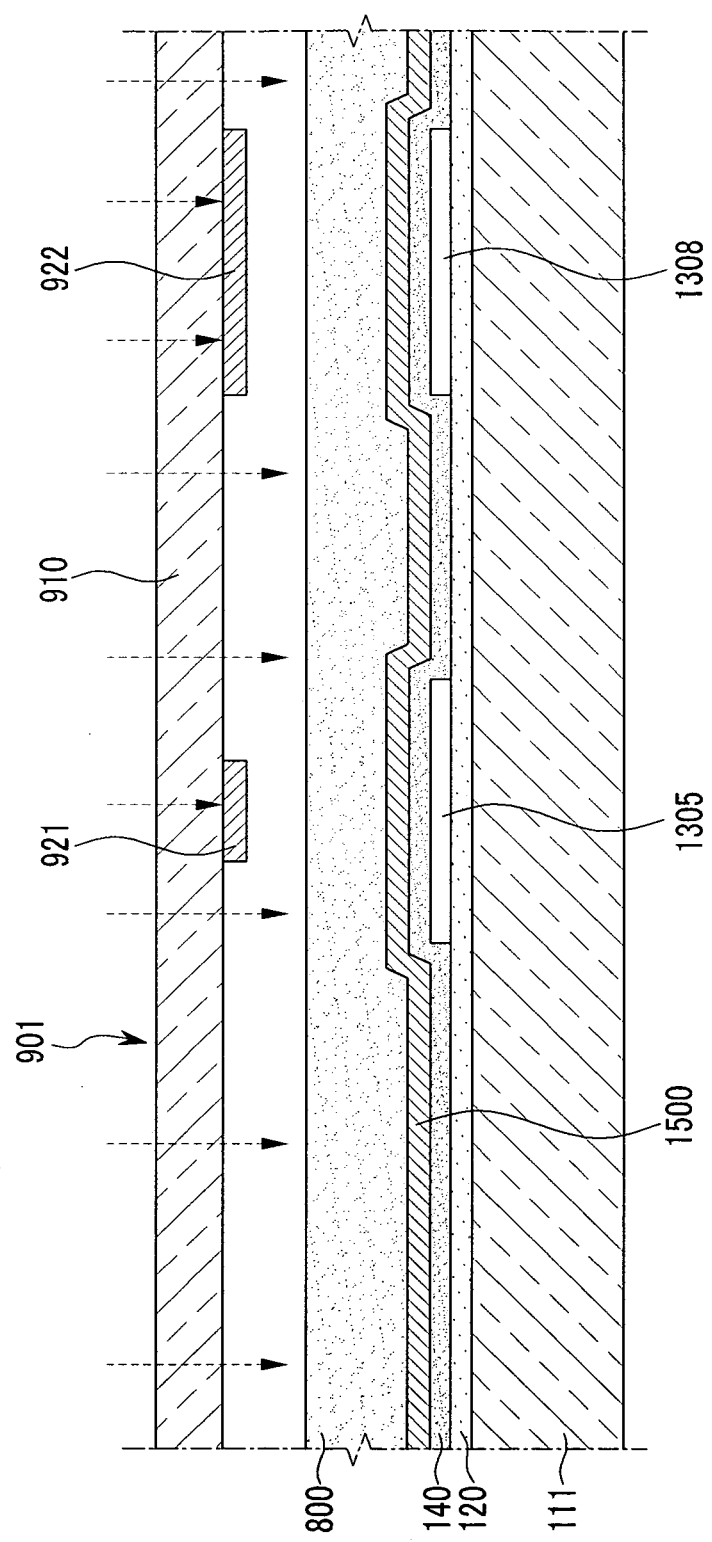

As illustrated in FIG. 6, a photoresist material may be coated on the gate metal layer 1500 to form a photoresist film 800. The photoresist film 800 have a thickness of about 1000 nm to about 2000 nm. The photoresist film 800 may overlap semiconductor layer precursor 1305 and first capacitor electrode precursor 1308.

The photoresist film 800 may be firstly exposed to light by using a first mask 901. The first mask 901 may include a base substrate 910, and gate and capacitor shields 921 and 922 formed on the base substrate 910. The gate shield 921 may be positioned across a region of the gate metal layer 1500 where the gate electrode 155 is to be formed, i.e., to prevent exposure of the location of the gate electrode 155 to light. The capacitor shield 922 may be positioned across a region of the gate metal layer 1500 where the second capacitor electrode 158 is to be formed, i.e., to prevent exposure of the location of the second capacitor electrode 158 to light.

Figure 7:
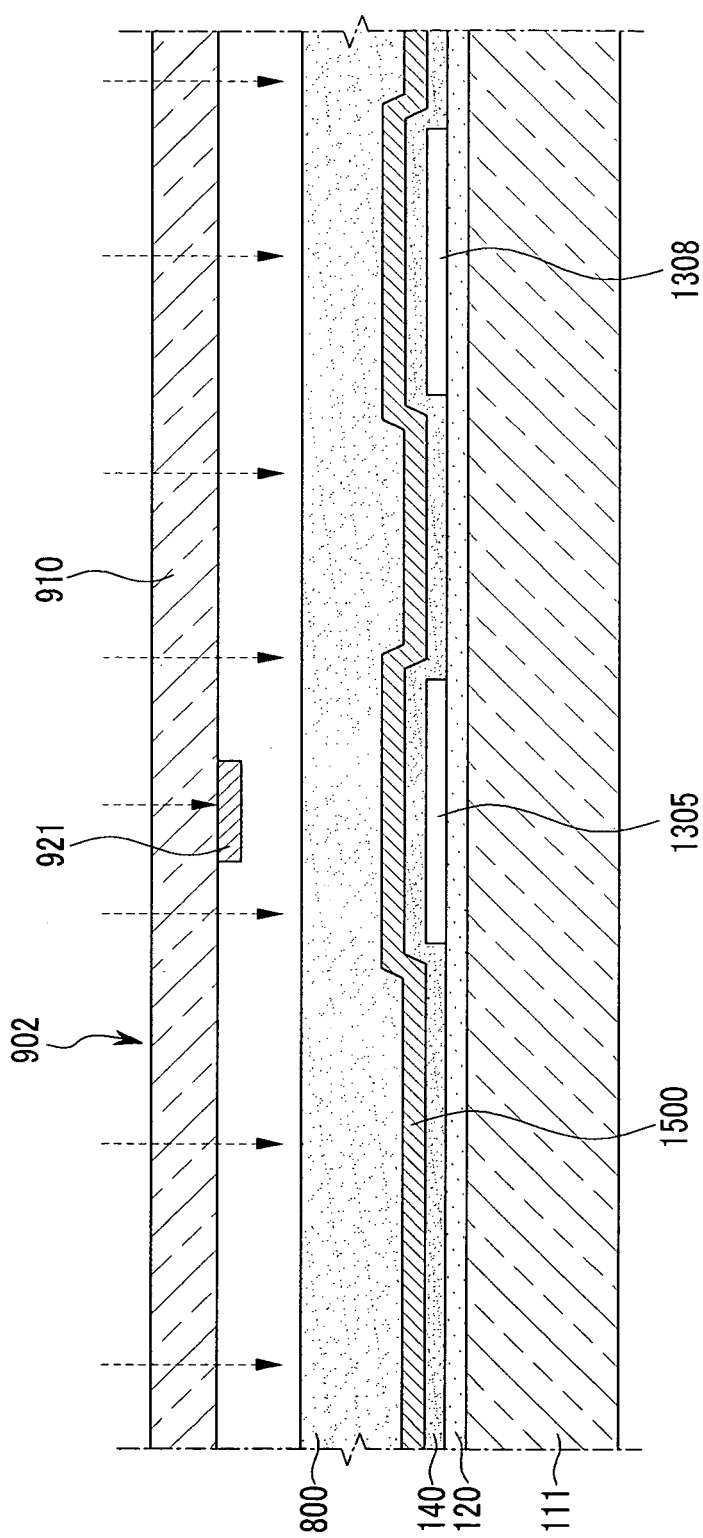

Then, as illustrated in FIG. 7, the photoresist film 800 may be secondly exposed to light by using a second mask 902. The second mask 902 may have only the gate shield 921.

Figure 8:
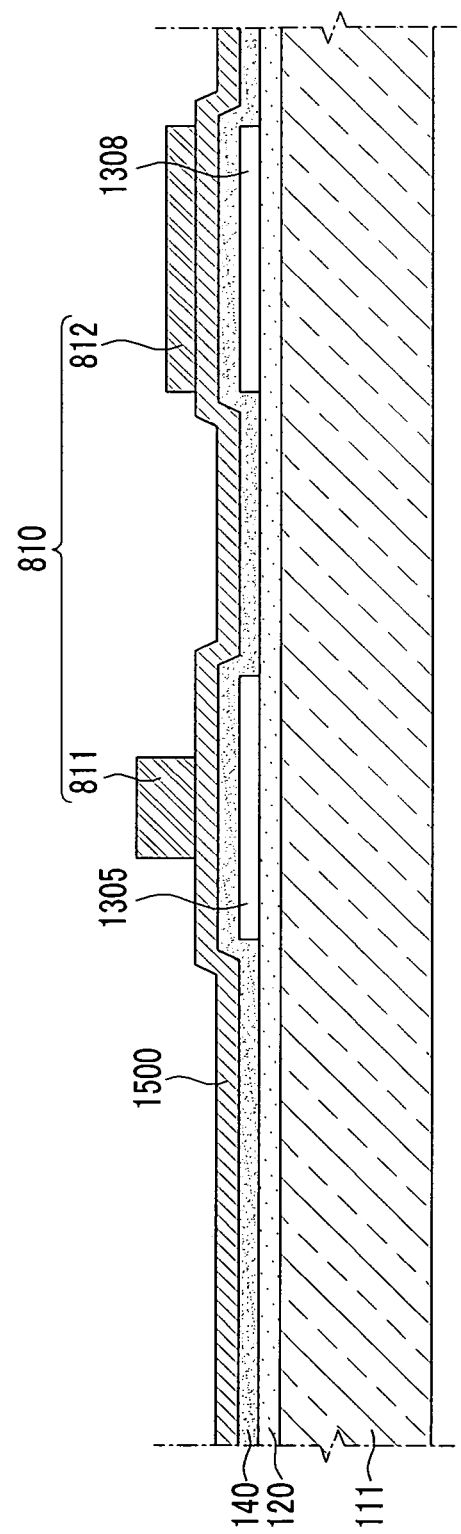

As illustrated in FIG. 8, the photoresist film 800 may be developed to form a photoresist pattern 810. The photoresist pattern 810 may have a first portion 811 disposed at the location of the gate electrode 155 and a second portion 812 disposed at the location of the second capacitor electrode 158. The second portion 812 may have a smaller thickness than that of the first portion 811, since the second portion 812 is not covered by the second mask 902 in the second light exposure described with reference to FIG. 7. The gate metal layer 1500 may be exposed in areas not covered by the first and second portions 811 and 812 of the photoresist pattern 810.

Figure 9:
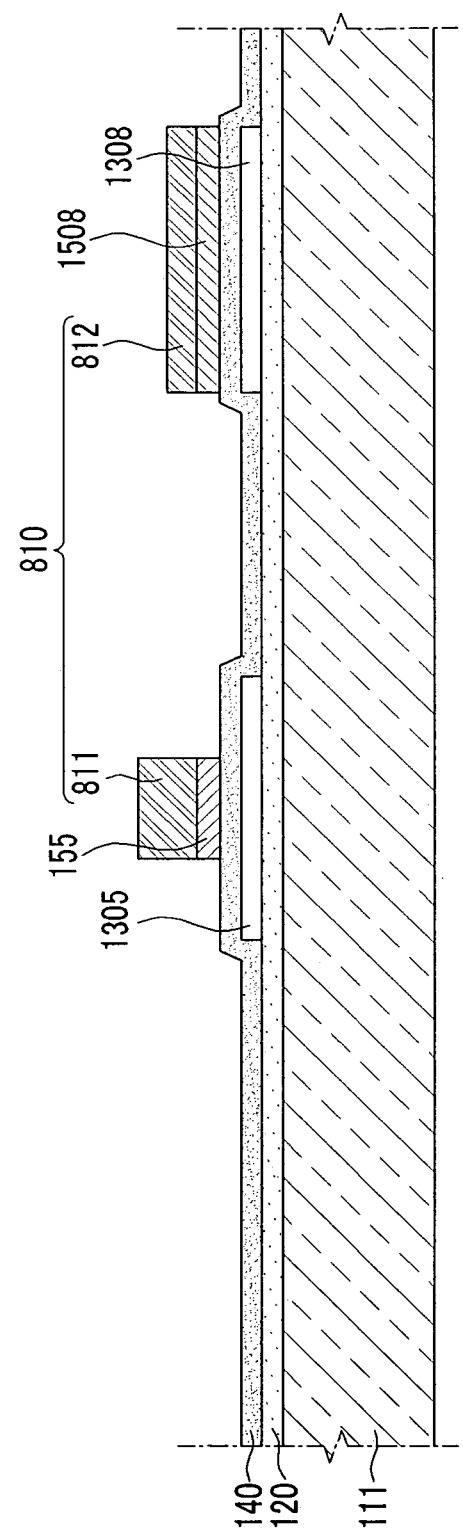

As illustrated in FIG. 9, the gate metal layer 1500 may be etched by using the photoresist pattern 810 as an etching mask to form the gate electrode 155 and a second capacitor electrode precursor 1508.

Figure 10:
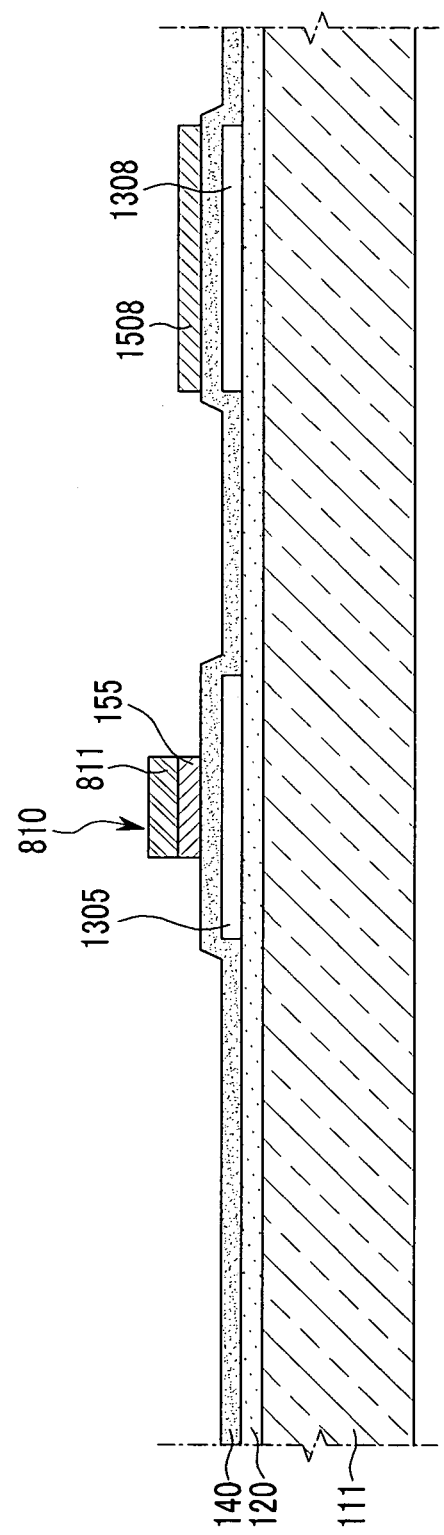

As illustrated in FIG. 10, the second portion 812 of the photoresist pattern 810 may be removed to expose the second capacitor electrode precursor 1508. At this time, the first portion 811 of the photoresist pattern 810 may be, e.g., only, partially removed, i.e., a thickness of the first portion 811 may be reduced by a thickness of the removed second portion 812.

Figure 11:
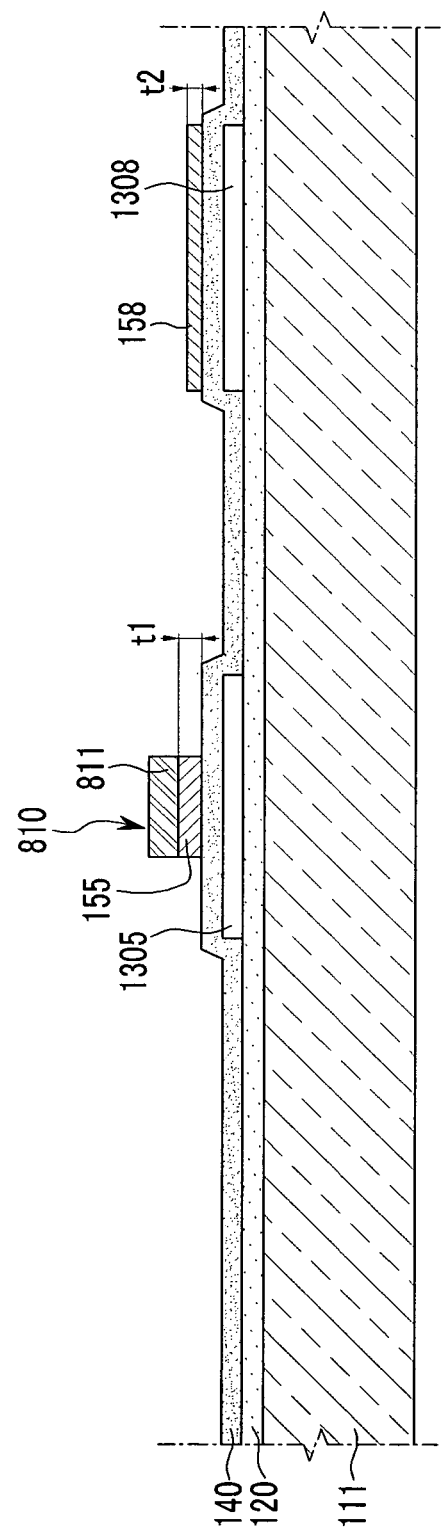

Then, as illustrated in FIG. 11, the second capacitor electrode precursor 1508 may be partially etched by using the photoresist pattern 810 to form the second capacitor electrode 158 with a smaller thickness than that of the gate electrode 155. In other words, while the gate electrode 155 is covered with the photoresist pattern 810, the second capacitor electrode precursor 1508 may be etched to adjust thickness thereof, i.e., reduce the thickness to about 75% or less of the thickness of the gate electrode 155. The second capacitor electrode 158 may have a thickness t2, e.g., of about 10 nm to about 140 nm, and the gate electrode 155 may have a thickness t1, e.g., of about 170 nm or more. The thickness t2 of the second capacitor electrode 158 may be about 75% or less of the thickness t1 of the gate electrode 155.

Figure 12:
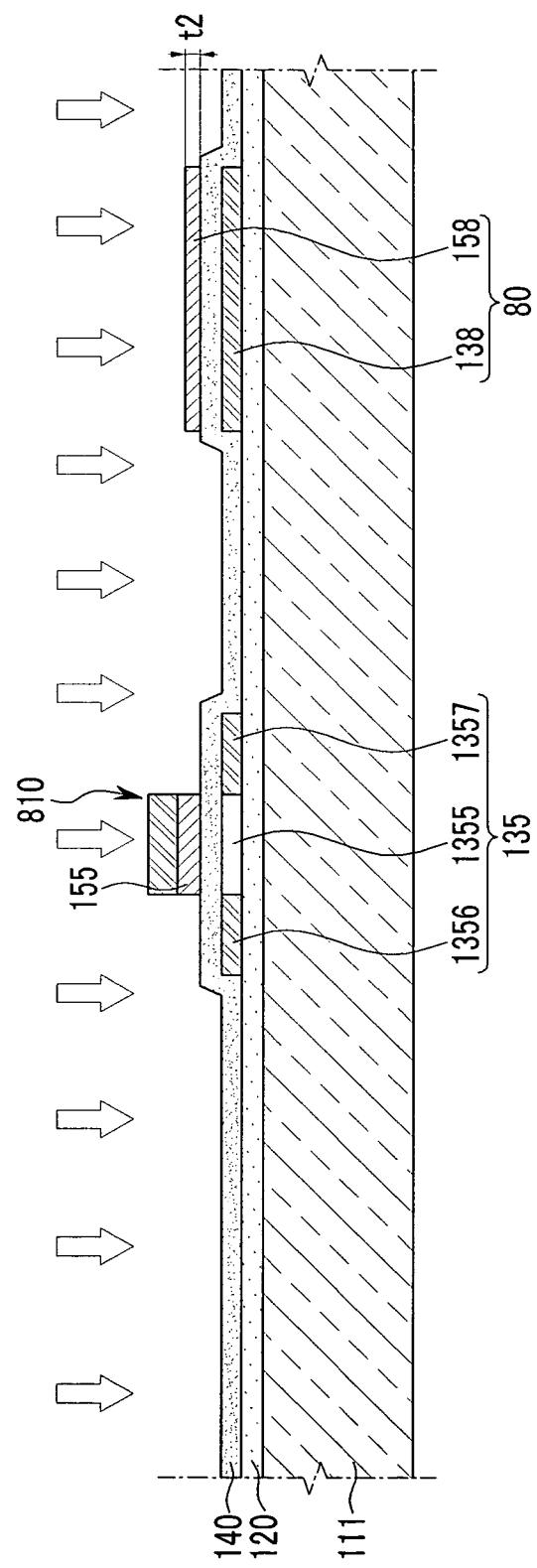

As illustrated in FIG. 12, an impurity may be doped into the semiconductor layer precursor 1305 and the first capacitor electrode precursor 1308 to form the semiconductor layer 135 and the first capacitor electrode 138, respectively. In detail, the impurity may be doped, e.g., only, into the first capacitor electrode precursor 1308 and the source and drain regions 1357 and 1356 of the semiconductor layer 135, since the gate electrode 155 prevents impurity implantation into the channel region 1355. In this regard, the gate electrode 155 may have a thickness of about 170 nm or more in order to prevent the impurity from being doped into the channel region 1355.

In this way, when the impurity is doped into the semiconductor layer precursor 1305, the semiconductor layer 135 may be formed with the channel region 1355 overlapped with the gate electrode 155, and the source and drain regions 1357 and 1356 formed at both sides of the channel region 1355. That is, the channel region 1355 may be an intrinsic semiconductor, and the source and drain regions 1357 and 1356 may be extrinsic semiconductors.

Furthermore, the first capacitor electrode 138 may be formed to be substantially equivalent, e.g., in terms of material, to the source and drain regions 1357 and 1356 of the semiconductor layer 135. Since the second capacitor electrode 158 is thinner than the gate electrode 155, the implanted impurity may pass through the second capacitor electrode 158 into the first capacitor electrode precursor 130 to form the first capacitor electrode precursor 1308, i.e., to form an extrinsic semiconductor. If the second capacitor electrode 158 is too thick, the impurity does not pass through the second capacitor electrode 158, so that the first capacitor electrode 138 may have reduced conductivity. If the second capacitor electrode 158 is too thin, the electric characteristic of the second capacitor electrode 158 may deteriorate while making the capacitance of the capacitor 80 poor. Therefore, the second capacitor electrode 158 may have a thickness of about 10 nm to about 140 nm.

The impurity may be any one of a P-type impurity and an N-type impurity. The type of impurity may be determined according to a type of the second TFT 20. For example, the impurity may be a P-type impurity, e.g., boron. For example, boron ions, e.g., $B_2H_5$, may be doped into the first capacitor electrode 138.

The impurity may be ion-injected into the first capacitor electrode 138 with energy of about 80 keV or more at a dose of about 1.0e15 atoms/cm$^2$ or more. This condition may be established, such that the impurity passing through the second capacitor electrode 158 may be effectively doped into the first capacitor electrode 138.

In this way, the capacitor 80 may be formed with the first capacitor electrode 138 and the second capacitor electrode 158, and the gate insulating layer 140 therebetween. The first capacitor electrode 138 may be easily formed during the process of forming the semiconductor layer 135 without conducting any separate processing steps, e.g., without using a separate doping mask process for forming the first capacitor electrode 138 that may require complicated processing steps and increased production costs. Accordingly, the whole process of fabricating the OLED display 101 may be simplified in a very efficient manner, so production costs may be substantially reduced.

Figure 13:
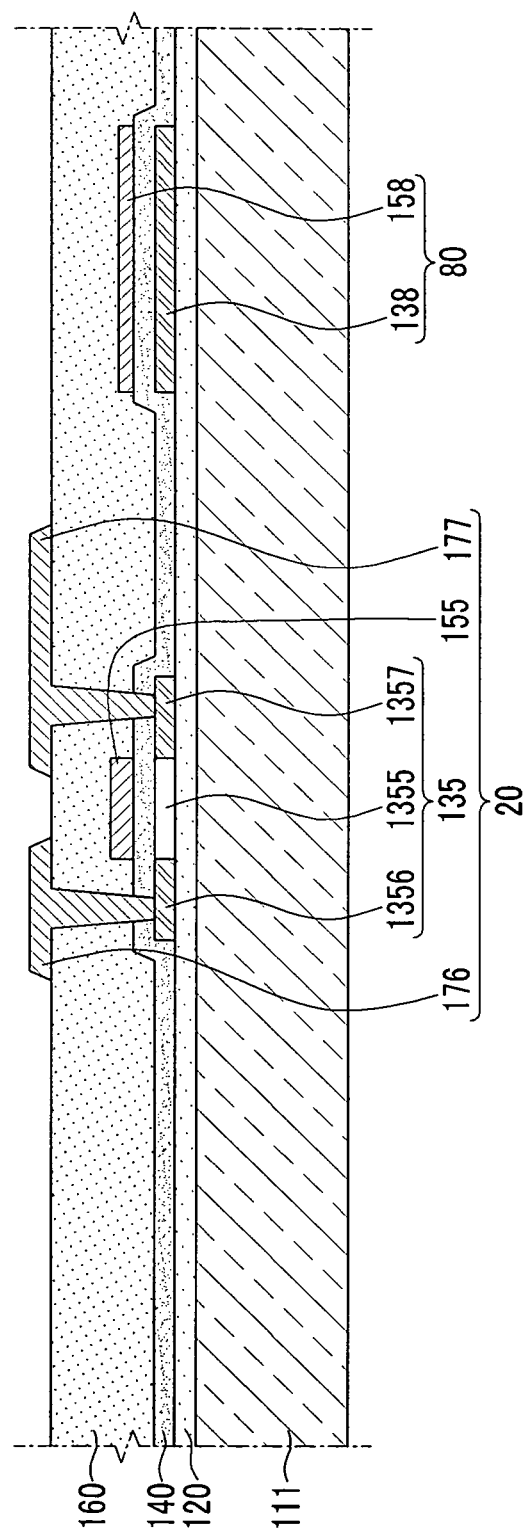

Thereafter, as shown in FIG. 13, the photoresist pattern 810 may be, e.g., completely, removed from the gate electrode 155, and the interlayer insulating layer 160 may be formed on the gate electrode 155 and the second capacitor electrode 158. The photoresist pattern 810 may be removed from the gate electrode 155 before the impurity doping process.

As in the gate insulating layer 140, the interlayer insulating layer 160 may be formed of, e.g., one or more of tetraethoxysilane (TEOS), silicon nitride ($SiN_x$) or silicon oxide ($SiO_x$), by using, e.g., PECVD. The interlayer insulating layer 160 and the gate insulating layer 140 may be etched together, e.g., through photolithography, to form the source and drain contact holes 167 and 166 partially exposing the source and drain regions 1357 and 1356 of the semiconductor layer 135, respectively.

Then, the source and drain electrodes 177 and 176 may be formed on the interlayer insulating layer 160. At this time, the source and drain electrodes 177 and 176 may contact the source and drain regions 1357 and 1356 of the semiconductor layer 135 through the source and drain contact holes 167 and 166, respectively.

As illustrated in FIG. 3, the planarization layer 180 may be formed on the source and the drain electrodes 177 and 176. The planarization layer 180 may have the anode contact hole 186 exposing the drain electrode 176.

The pixel electrode 710 may then be formed on the planarization layer 180. The pixel electrode 710 may contact the drain electrode 176 through the anode contact hole 186. However, an exemplary embodiment is not limited to the above-described, e.g., the planarization layer 180 may be omitted. If the planarization layer 180 is omitted, the drain electrode 176 may directly become the pixel electrode 710.

The pixel definition layer 190 may be formed on the planarization layer 180. The pixel definition layer 190 may have the opening 195 exposing the pixel electrode 710. The organic emissive layer 720 may be formed within the opening 195 of the pixel definition layer 190, and the common electrode 730 may be formed on the organic emissive layer 720 to complete the OLED 70.

With the above-described processing steps, the OLED display 101 according to an exemplary embodiment may be completed. That is, with an exemplary embodiment, the process of fabricating the OLED display 101 may be simplified in an efficient manner.

OLED displays according to Examples and a Comparative example will now be described with reference to FIG. 14 to FIG. 17. FIG. 14 to FIG. 17 illustrate graphs of CV characteristics of OLED displays according to the Examples and a Comparative example.

The OLED displays in the Examples included the gate electrode 155 with a thickness of about 170 nm or more and the second capacitor electrodes 158 with varying thicknesses that were smaller than the thickness of the gate electrode 155. The first capacitor electrode 138 was doped through the second capacitor electrode 158. The second capacitor electrode 158 was formed of molybdenum (Mo), and $B_2H_5$ was used as the impurity. The impurity was ion-injected with energy of about 85 keV at a dose of about 3.0e15 atoms/cm$^2$. CV characteristic of the OLED displays according to the Examples are illustrated in FIGS. 15-17.

Figure 14:
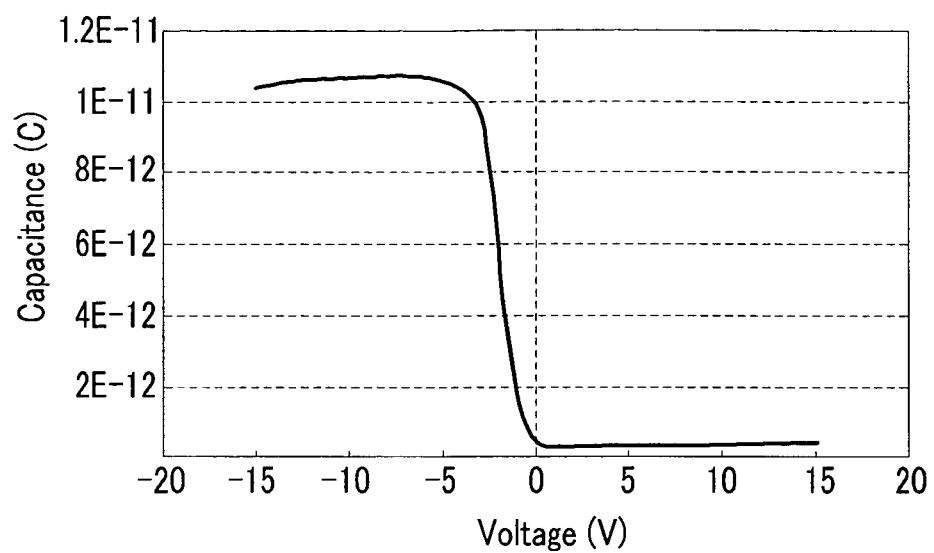
FIG. 14 to FIG. 17 illustrate graphs of CV characteristic of OLED displays according to examples and a comparative example.

FIG. 14 illustrates a graph of the CV characteristic of an OLED display according to the Comparative example. In the Comparative example, the OLED display was substantially the same as the OLED displays in the Examples, with the exception that the second capacitor electrode had a substantially same thickness as the gate electrode, i.e., about 170 nm. As illustrated in FIG. 14, the capacitor in the OLED display of the Comparative example did not operate normally.

Figure 15:
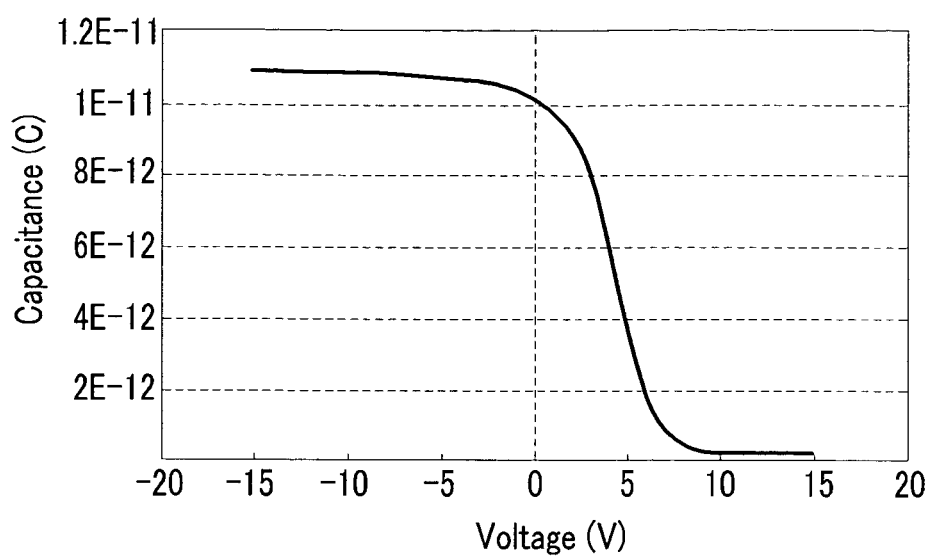

FIG. 15 illustrates a graph of the CV characteristic of an OLED display according to Example 1. In Example 1, the second capacitor electrode 158 had a thickness of 130 nm. In Example 1, as illustrated in FIG. 15, the capacitor 80 operated well, but the capacitance decreased as the voltage increased.

Figure 16:
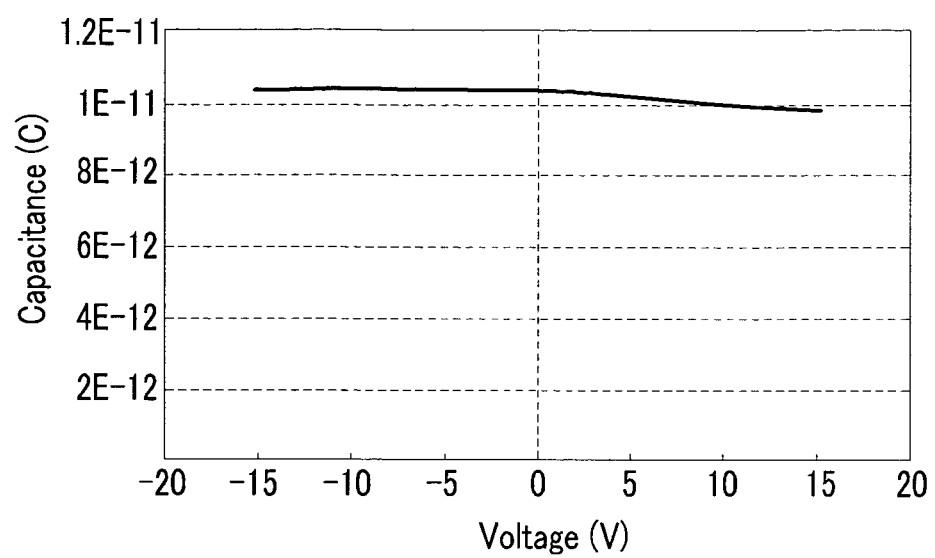
Figure 17:
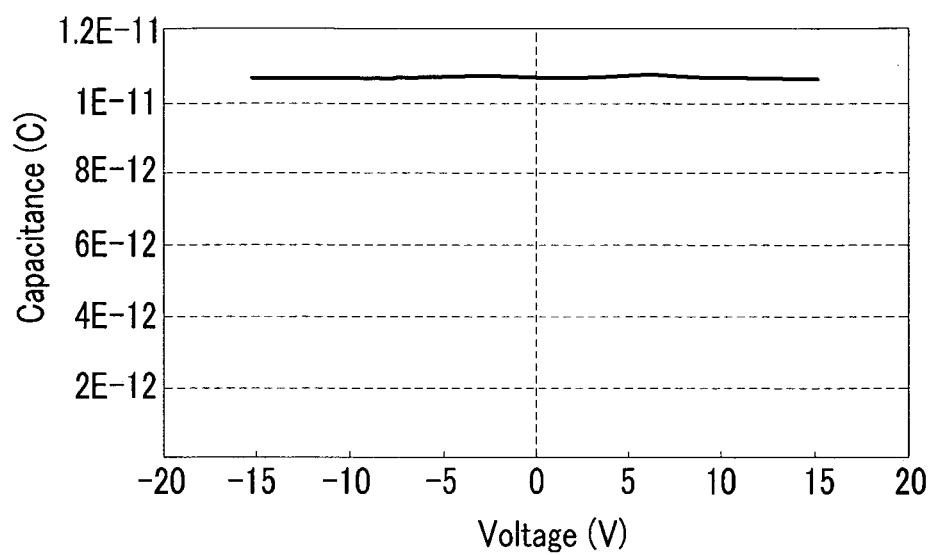

FIG. 16 illustrates a graph of the CV characteristic of an OLED display according to Example 2. In Example 2, the second capacitor electrode 158 had a thickness of 100 nm. In Example 2, as illustrated in FIG. 16, the capacitor 80 operated normally throughout the entire voltage range.

FIG. 17 illustrates a graph of the CV characteristics of an OLED display according to Example 3. In Example 3, the second capacitor electrode 158 had a thickness of 30 nm. In Example 2, as illustrated in FIG. 17, the capacitor 80 operated normally throughout the entire voltage range.

As illustrated in FIGS. 14-17, when the second capacitor electrode 158 had a thickness of 130 nm or less, the impurity was doped into the first capacitor electrode 138, and the capacitor 80 operated well. Further, when the second capacitor electrode 158 had a thickness of 100 nm or less, the capacitor 80 operated stably throughout the entire voltage range without incurring any capacitance loss.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. An organic light emitting diode display, comprising:
a substrate main body;

a semiconductor layer on the substrate main body, the semiconductor layer including an impurity-doped polycrystalline silicon layer;

a first capacitor electrode on the substrate main body, the first capacitor electrode including an impurity-doped polycrystalline silicon layer, and bottom surfaces of the first capacitor electrode and semiconductor layer facing the substrate main body being substantially coplanar;

a gate insulating layer on the semiconductor layer and the first capacitor electrode;

a gate electrode on the semiconductor layer with the gate insulating layer therebetween;

a second capacitor electrode on the first capacitor electrode with the gate insulating layer therebetween, bottom surfaces of the second capacitor electrode and gate electrode facing the substrate main body being substantially coplanar, and the second capacitor electrode having a smaller thickness than the gate electrode; and an organic light emitting diode on the substrate main body, a pixel electrode of the organic light emitting diode not overlapping any portion of the second capacitor electrode.

2. The organic light emitting diode display as claimed in claim 1, wherein the gate electrode and the second capacitor electrode include a substantially same metal, the metal being one or more of molybdenum (Mo), chromium (Cr), and tungsten (W).

3. The organic light emitting diode display as claimed in claim 2, wherein the impurity in the first capacitor electrode and the semiconductor layer includes boron.

4. The organic light emitting diode display as claimed in claim 2, wherein the gate insulating layer includes one or more of tetraethoxysilane (TEOS), silicon nitride ($SiN_x$), and silicon oxide ($SiO_x$).

5. The organic light emitting diode display as claimed in claim 2, wherein the semiconductor layer includes a channel region with source and drain regions at both sides of the channel region, the channel region being an intrinsic semiconductor, and the source and drain regions being extrinsic semiconductors.

6. An organic light emitting diode display, comprising:
a substrate main body;
a semiconductor layer on the substrate main body, the semiconductor layer including an impurity-doped polycrystalline silicon layer;
a first capacitor electrode on the substrate main body, the first capacitor electrode including an impurity-doped polycrystalline silicon layer, and bottom surfaces of the first capacitor electrode and semiconductor layer facing the substrate main body being substantially coplanar;
a gate insulating layer on the semiconductor layer and the first capacitor electrode;
a gate electrode on the semiconductor layer with the gate insulating layer therebetween; and
a second capacitor electrode on the first capacitor electrode with the gate insulating layer therebetween, bottom surfaces of the second capacitor electrode and gate electrode facing the substrate main body being substantially coplanar, and the second capacitor electrode having a smaller thickness than the gate electrode,
wherein the thickness of the second capacitor electrode is about 75% or less of the thickness of the gate electrode.

7. The organic light emitting diode display as claimed in claim 1, wherein the gate electrode has a thickness of 170 nm or more, and the second capacitor electrode has a thickness of about 10 nm to about 140 nm.

8. A method of manufacturing an organic light emitting diode display, the method comprising:
forming a semiconductor layer on a substrate main body, the semiconductor layer including an impurity-doped polycrystalline silicon layer;
forming a first capacitor electrode on the substrate main body, such that bottom surfaces of the first capacitor electrode and semiconductor layer facing the substrate main body are substantially coplanar, and the first capacitor electrode includes an impurity-doped polycrystalline silicon layer;
forming a gate insulating layer on the semiconductor layer and the first capacitor electrode;
forming a gate electrode on the semiconductor layer with the gate insulating layer therebetween;
forming a second capacitor electrode on the first capacitor electrode with the gate insulating layer therebetween, such that bottom surfaces of the second capacitor electrode and gate electrode facing the substrate main body are substantially coplanar, and the second capacitor electrode has a smaller thickness than the gate electrode; and
forming an organic light emitting diode on the substrate main body, such that a pixel electrode of the organic light emitting diode does not overlap any portion of the second capacitor electrode.

9. The method as claimed in claim 8, further comprising:
forming a polycrystalline silicon layer on the substrate main body;
patterning the polycrystalline silicon layer to form a semiconductor layer precursor and a first capacitor electrode precursor;
forming the gate insulating layer on the semiconductor layer precursor and the first capacitor electrode precursor;
forming the gate electrode on the gate insulating layer, such that the gate electrode partially overlaps the semiconductor layer precursor, while forming the second capacitor electrode on the gate insulating layer, such that the second capacitor electrode overlaps the first capacitor electrode precursor; and
doping an impurity into the semiconductor layer precursor and the first capacitor electrode precursor to form the semiconductor layer and the first capacitor electrode, the impurity being doped into the first capacitor electrode through the second capacitor electrode.

10. The method as claimed in claim 9, wherein the gate electrode and the second capacitor electrode are formed of a substantially same metal, the metal being at least one of molybdenum (Mo), chromium (Cr), and tungsten (W).

11. The method as claimed in claim 10, wherein the gate electrode is formed to have a thickness of about 170 nm or more, and the thickness of the second capacitor electrode is about 75% or less of the thickness of the gate electrode.

12. The method as claimed in claim 11, wherein the second capacitor electrode is formed to have a thickness of about 10 nm to about 140 nm.

13. The method as claimed in claim 9, wherein the impurity is ion-injected with energy of about 80 keV or more at a dose of about $1.0e15$ atoms/cm$^2$ or more.

14. The method as claimed in claim 9, wherein the gate insulating layer includes at least one of tetraethoxysilane (TEOS), silicon nitride (SiNx), and silicon oxide (SiOx).

15. The method of as claimed in claim 9, wherein forming the gate electrode and the second capacitor electrode includes:
forming a gate metal layer on the gate insulating layer; and patterning the gate metal layer by photolithography through a photoresist pattern having a first portion placed over the gate electrode and a second portion placed over the second capacitor electrode, such that the second portion of the photoresist pattern has a smaller thickness than the first portion.

16. The method as claimed in claim 15, wherein patterning the gate metal layer includes:

etching the gate metal layer through the photoresist pattern to form the gate electrode and a second capacitor electrode precursor; and removing the second portion of the photoresist pattern, while partially etching the second capacitor electrode precursor to form the second capacitor electrode.

17. The method as claimed in claim 15, wherein forming the photoresist pattern includes:

forming a photoresist film on the gate metal layer;

firstly exposing the photoresist film to light through a first mask;

secondly exposing the photoresist film through a second mask different than the first mask; and developing the photoresist film.

18. The method as claimed in claim 17, wherein exposing the photoresist film to light through the first mask includes using a mask having a gate shield for preventing a location of the gate electrode from being exposed to light, and a capacitor shield for preventing a location of the second capacitor electrode from being exposed to light.

19. The method as claimed in claim 18, wherein exposing the photoresist film through the second mask includes using a mask that includes only a gate shield for preventing a location of the gate electrode from being exposed to light.

20. The organic light emitting diode display as claimed in claim 1, wherein the pixel electrode of the organic light emitting diode is electrically connected to a transistor having the semiconductor layer on the substrate main body, the gate electrode of the transistor not overlapping any portion of the second capacitor electrode.

* * * * *